(12) United States Patent
Seewann (10) Patent No.: US 7,501,854 B2
(45) Date of Patent: Mar. 10, 2009

(54) TRUE/COMPLEMENT GENERATOR HAVING RELAXED SETUP TIME VIA SELF-RESETTING CIRCUITRY

(75) Inventor: Ed Seewann, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 11/567,958

(22) Filed: Dec. 7, 2006

(65) Prior Publication Data

US 2008/0136452 A1    Jun. 12, 2008

(51) Int. Cl.
G06F 7/38 (2006.01)
H03K 19/173 (2006.01)
H03K 19/177 (2006.01)

(52) U.S. Cl. ............................. 326/38; 326/37; 326/39; 326/40; 326/46

(58) Field of Classification Search .................... 326/38
See application file for complete search history.

(56) References Cited

U.S. PATENT DOCUMENTS

| | | | | |
|---|---|---|---|---|
| 5,132,990 A | * | 7/1992 | Dukes ......................... | 375/362 |
| 5,867,453 A | * | 2/1999 | Wang et al. .................. | 368/120 |
| 5,912,570 A | * | 6/1999 | Kuusisto ..................... | 327/142 |
| 7,035,127 B1 | * | 4/2006 | Adams et al. .............. | 365/49.1 |

FOREIGN PATENT DOCUMENTS

WO    WO 01/04906 A1    1/2001

* cited by examiner

*Primary Examiner*—Rexford Barnie
*Assistant Examiner*—Matthew C. Tabler
(74) *Attorney, Agent, or Firm*—Casimer K. Salys; Dillon & Yudell LLP (57) ABSTRACT

An integrated circuit includes a data node, an output node, and set logic coupling to the data node to the output node. The set logic changes a state of the output node in response to a change in state of the data node. The integrated circuit also includes a reset transistor, coupled to the data node, that resets the data node to a first state in response to a transition in a timing signal, an input transistor, coupled to the data node, that asserts the data node to a second state in response to receipt of a data signal, and reset logic coupled between the output node and the data node. The first reset logic resets the output node to an original state in response to resetting of the data node if the output node achieves a set state. The integrated circuit further includes feedback logic coupled between the output node and a reset input node of the reset logic that limits a duration of operation of the reset logic.

17 Claims, 6 Drawing Sheets

TRUE/COMPLEMENT GENERATOR HAVING RELAXED SETUP TIME VIA SELF-RESETTING CIRCUITRY

CROSS-REFERENCE TO RELATED APPLICATION

The present application is related to U.S. patent application Ser. No. 11/567,941, which is filed concurrently herewith and incorporated herein by reference in its entirety.

BACKGROUND OF THE INVENTION

1. Technical Field

The present invention relates in general to integrated circuits.

2. Description of the Related Art

In many conventional integrated circuits, circuit operation is timed utilizing a clock signal, which synchronizes the flow of data signals through the circuit. A key design consideration for such clocked circuits is the timing requirements of the data signal(s) with reference to the clock signal, including the setup and hold times for the data signal(s). The setup time refers to the required relative arrival times of the clock and data signals. Hold time refers to the time following a clock pulse during which the data signal must remain stable in order to guarantee that the data passed to the next circuit stage is correct. If circuit timing requirements are not met, for example, if a data signal fails to meet the required setup time, the circuit may output incorrect data, possibly cascading to cause a larger system error or failure.

Because integrated circuits embodying the same circuit design in practice experience a range of timing behaviors due to a number of conditions, like temperature, voltage reference variations, fabrication process variations, etc., the timing analysis phase of the circuit design process typically includes so-called "corner" analysis in order to qualify an integrated circuit design across a wide range of conditions. In performing corner analysis, the operative assumption is that if a design works under each extreme condition, then assuming monotonic behavior, the design is also qualified for all intermediate conditions.

To enable a circuit design to pass corner analysis, timing requirements are often relaxed by the addition of excess timing margin to the circuit timing, thus enabling the timing requirements to be met across a wide range of conditions. As will be appreciated, the introduction of excess timing margin in a circuit design, while ensuring correct circuit operations, will eventually cause to circuit to fail its performance requirements.

SUMMARY OF THE INVENTION

In view of the foregoing, the present invention appreciates that it would be desirable to enable an integrated circuit to meet its setup time through improvements in the circuit design itself rather than the mere addition of timing margin to the design.

In one embodiment, an integrated circuit includes a data node, an output node, and set logic coupling to the data node to the output node. The set logic changes a state of the output node in response to a change in state of the data node. The integrated circuit also includes a reset transistor, coupled to the data node, that resets the data node to a first state in response to a transition in a timing signal, an input transistor, coupled to the data node, that asserts the data node to a second state in response to receipt of a data signal, and reset logic coupled between the output node and the data node. The first reset logic resets the output node to an original state in response to resetting of the data node if the output node achieves a set state. The integrated circuit further includes feedback logic coupled between the output node and a reset input node of the reset logic that limits a duration of operation of the reset logic. In one embodiment, the integrated circuit includes an input stage, coupled to the data node, that includes a data input that receives a data signal, a clock input that receives a clock signal, a first logic gate having a first input coupled to the clock input, a second input coupled to the data input, and an output, and at least a second logic gate having a first input coupled to the clock input, a second input coupled to the output of the first logic gate, and an output coupled to the data node. The first and second logic gates are interconnected such that the clock signal utilized to time circuit operation both gates and is gated by the data signal to establish reciprocal clock and data gating.

In another embodiment, a True/Complement circuit includes a True/Complement generator that outputs True and Complement signals, a pulse generator that provides a clock signal to the True/Complement generator, a latch coupled to receive a data input signal and output a latched data signal to the True/Complement generator, a bypass data path that provides a bypass data signal to the True/Complement generator, and a select input coupled to the True/Complement generator that provides a select signal to the True/Complement generator to cause the True/Complement generator to select among the bypass data signal and latched data signal as a data input signal for which the True/Complement generator generates the True and Complement signals. In at least one embodiment, the True/Complement generator includes a mask input that when asserted disables generation of the True and Complement signals by the True/Complement generator.

In another embodiment, a memory circuit includes a plurality of True/Complement circuits each including a True/Complement generator that outputs True and Complement signals, a pulse generator that provides a clock signal to the True/Complement generator, a latch coupled to receive a data input signal and output a latched data signal to the True/Complement generator, a bypass data path that provides a bypass data signal to the True/Complement generator, and a select input coupled to the True/Complement generator that provides a select signal to the True/Complement generator to cause the True/Complement generator to select among the bypass data signal and latched data signal as a data input signal for which the True/Complement generator generates the True and Complement signals. The memory circuit further includes a plurality of memory cells that receive the True and Complement signals and generate a plurality of matchline signals and a plurality of wordline driver circuits each coupled to receive a respective one of the matchline signals and to generate a wordline signal.

In still another embodiment, a processor includes a cache memory that employs real addresses, a plurality of execution units for executing instructions, an instruction sequencing unit that fetches instructions from the cache memory for execution by the execution units, and an effective-to-real address translation table that translates effective addresses to real addresses to permit access to the cache memory. The effective-to-real address translation table includes a plurality of True/Complement circuits each including a True/Complement generator that outputs True and Complement signals, a pulse generator that provides a clock signal to the True/Complement generator, a latch coupled to receive a data input signal and output a latched data signal to the True/Complement generator, a bypass data path that provides a bypass data signal to the True/Complement generator, and a select input coupled to the True/Complement generator that provides a select signal to the True/Complement generator to cause the True/Complement generator to select among the bypass data signal and latched data signal as a data input signal for which the True/Complement generator generates the True and Complement signals. The translation table further includes a plurality of memory cells that receive the True and Complement signals and generate a plurality of matchline signals, a plurality of wordline driver circuits each coupled to receive a respective one of the matchline signals and to generate a wordline signal, and a random access memory having a plurality of entries corresponding in number to the plurality of content addressable memory cells, where each entry of the plurality of receives a respective wordline signal generated by one of the plurality of wordline driver circuits.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
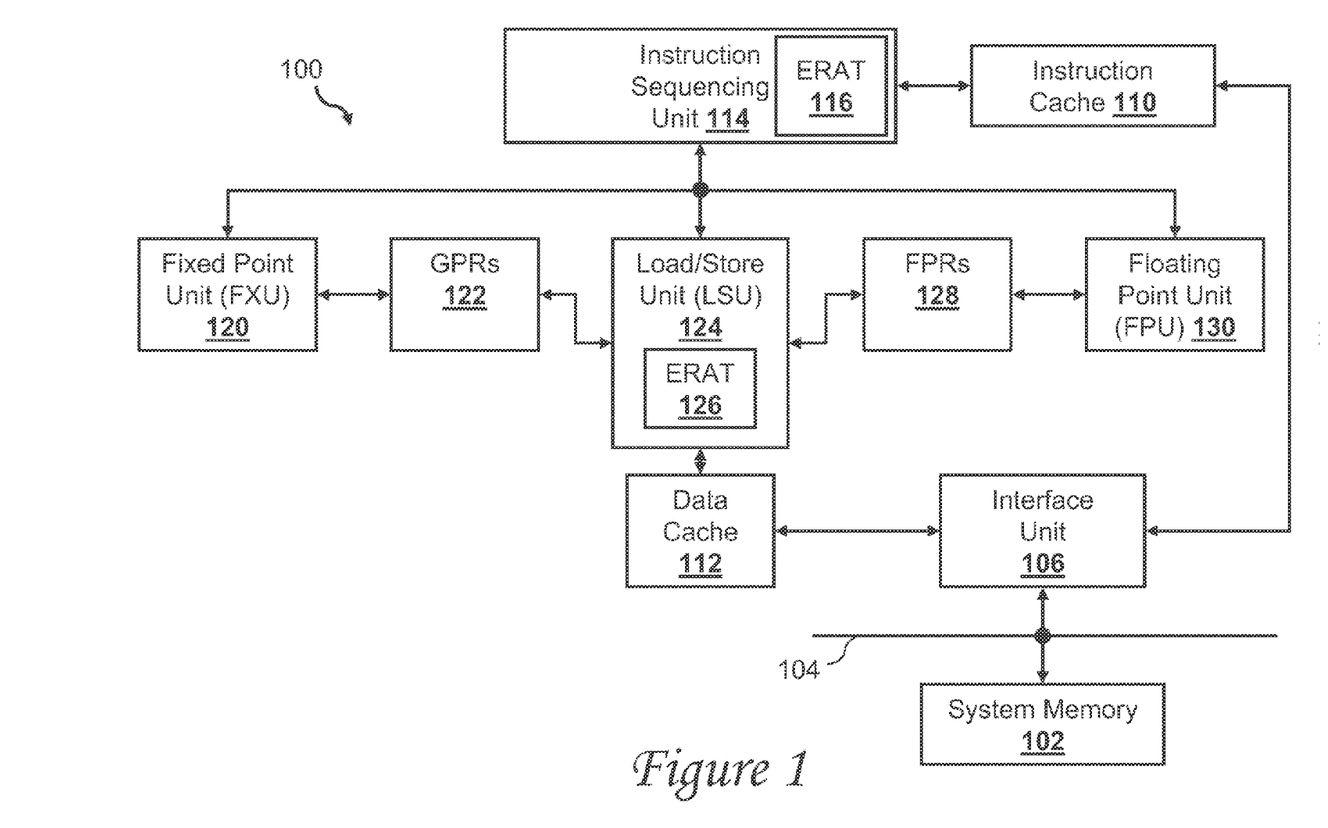
FIG. 1 is a high level block diagram of an exemplary integrated circuit in accordance with the present invention.

With reference now to FIG. 1, there is illustrated a high level block diagram of an exemplary embodiment of an integrated circuit 100 in accordance with the present invention. In the depicted embodiment, integrated circuit 100 comprises a superscalar processor, such as one of the POWER™ line of processors available from IBM Corporation of Armonk, N.Y., in which various execution units, registers, buffers, memories, and other functional units are all formed of integrated circuitry.

As illustrated in FIG. 1, integrated circuit 100 may be coupled via an interface unit 106 to an interconnect fabric 104 to form a larger data processing system such as a server computer system. Integrated circuit 100 includes an on-chip cache subsystem including bifurcated level one (L1) instruction and data caches 110 and 112, respectively, to provide low latency access to cache lines corresponding to memory locations in a system memory 102 coupled to interconnect fabric 104. Integrated circuit 100 may further include additional levels of cache memory (e.g., L2, L3, etc.).

Instructions are fetched from instruction cache 110 and ordered for processing by instruction sequencing unit 114, which includes effective-to-real address translation (ERAT) table 116 for translating effective instruction fetch addresses generated by ISU 114 into the real addresses employed by instruction caches 110 and system memory 102. ISU 114 dispatches instructions according to instruction type. That is, fixed-point, load-store and floating point instructions are dispatched to fixed-point unit (FXU) 120, a load-store unit (LSUs) 124, and floating-point unit (FPU) 130, respectively. As further depicted in FIG. 1, LSU 124 further includes an ERAT table 126 for translating the target effective addresses of data accesses into the real addresses employed by data cache 112 and system memory 102.

Each of execution units 120, 124 and 130 is preferably implemented as an execution pipeline having a number of pipeline stages. During execution within one of execution units 120, 124 and 130, an instruction receives operands, if any, from one or more architected and/or rename registers within a register file (i.e., general purpose registers (GPRs) 122 or floating-point registers (FPRs) 128) coupled to the execution unit. After an execution unit finishes execution of an instruction, the execution unit notifies ISU 114, which schedules completion of instructions in program order.

Figure 2:
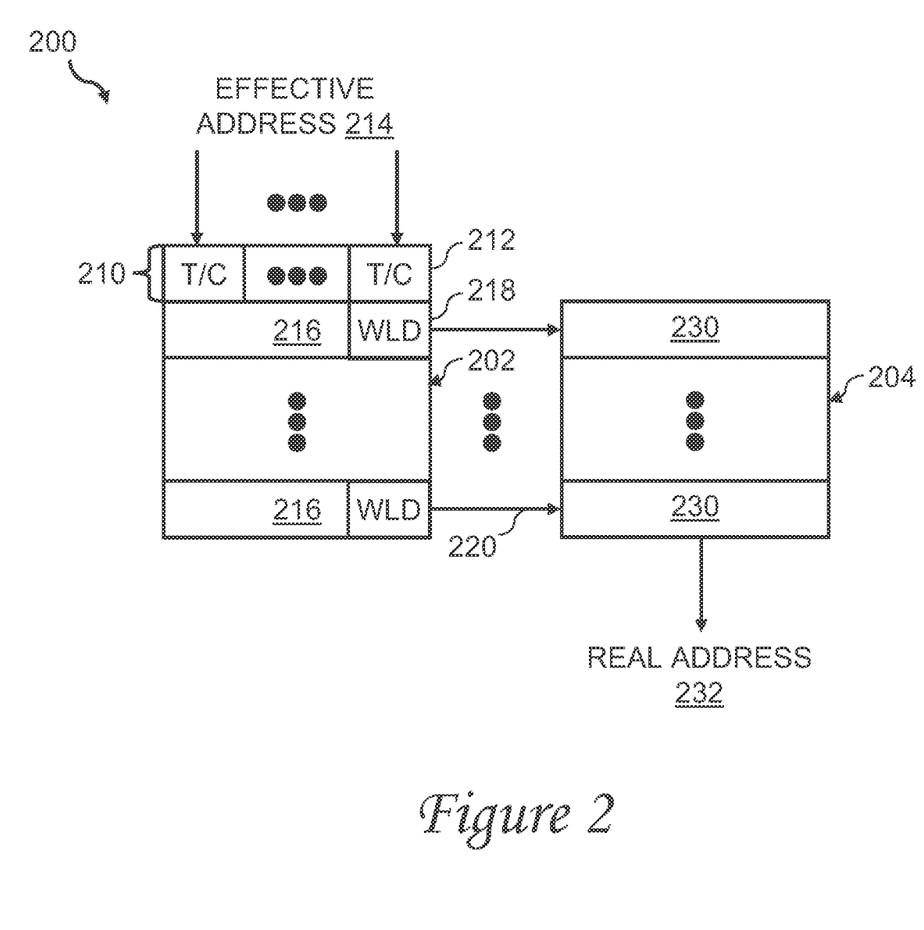
FIG. 2 is a more detailed view of an effective-to-real address translation (ERAT) circuit in the integrated circuit of FIG. 1.

Referring now to FIG. 2, there is depicted a high level block diagram of an exemplary embodiment of an ERAT table 200, which can be utilized to implement ERAT tables 116, 126 of FIG. 1. In the depicted embodiment, ERAT table 200 includes a content addressable memory (CAM) 202 and a random access memory (RAM) 204. CAM 202 has an input stage 210 comprising N True/Complement (T/C) circuits 212, which generate True and Complement signals for each of the N bits of an input effective address 214. The True and Complement signals are provided to each of a number (e.g., 128) of CAM entries 216, which each stores an effective address for which a translation has been obtained. Each CAM entry 216 has an associated word line driver (WLD) circuit 218 that asserts its wordline 220 to indicate an match between the effective address stored in the associated CAM entry 216 and the input effective address 214.

Still referring to FIG. 2, RAM 204 contains a number (e.g., 128) of entries 230. Each entry 230 is associated with a respective one of CAM cells 216 and contains a real address corresponding to the effective address buffered in the associated CAM entry 216. Thus, when a wordline 220 is asserted by a WLD circuit 218, the real address 232 corresponding to the input effective address 214 is output from RAM 204 to provide an address translation.

Figure 3:
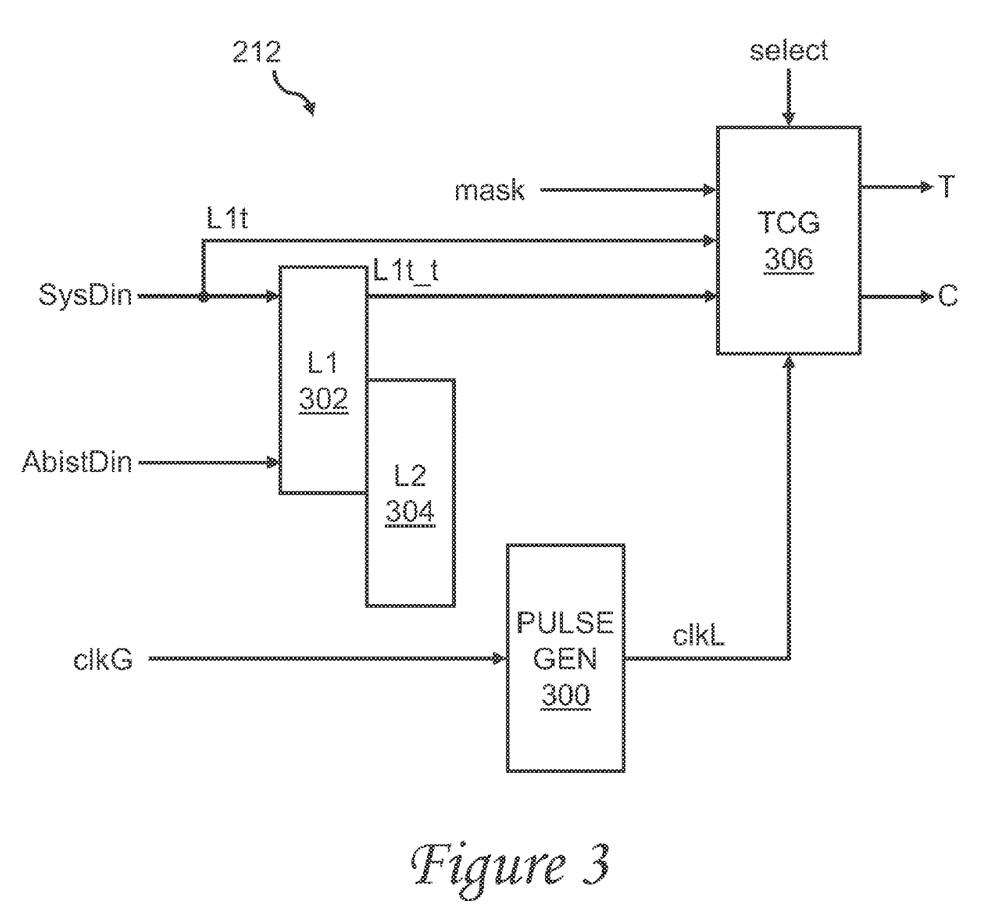
FIG. 3 is a more detailed view of the True/Complement (T/C) circuit of FIG. 2.

With reference to FIG. 3, there is illustrated a more detailed view of a True/Complement circuit 212 within ERAT table 200 of FIG. 2. As will be appreciated upon reference to FIG. 3, aspects of True/Complement circuit 212 not necessary for an understanding of the present invention have been simplified and/or eliminated to avoid obscuring the present invention.

As depicted, True/Complement circuit 212 includes a pulse generator 300, a two port L1/L2 latch pair comprising L1 latch 302 and an L2 latch 304, and a True/Complement generator (TCG) 306. Pulse generator 300 receives a clock signal clkG as an input and outputs a one-shot clock signal clkL, which is received as the clock input of TCG 306. The first port of L1 latch 302 is connected to a data input SysDin, at which an effective address bit arrives late in the previous cycle of clock signal clkG. The other port of L1 latch 302 is coupled to receive a test signal ABistDin used during test mode operation of Built-In Self Test (BIST) circuitry (not illustrated) of processor 100. While the ABistDin signal is routed only to L1 latch 302, SysDin is further routed to TCG 306 as data signal L1t. TCG 306 further receives a delayed SysDin signal from L1 latch 302 as data signal L1t_t, where the suffix "_t" denotes a test mode signal. TCG 306 generates True (T) and Complement (C) outputs for either the L1t signal or L1*t*_t signal in response to the state of a select signal provided by an unillustrated GPTR (General Purpose Test Register) latch, such that during normal system operation TCG 306 generates T and C signals for the L1*t* signal, and during test mode, for the L1*t*_t signal. As further illustrated in FIG. 3, TCG 306 has an additional input coupled to receive a mask signal. In response to assertion of the mask signal, TCG 306 does not generate T and C signals for either of its data inputs.

In normal system operation, that is, not during test mode operation, the setup time of data signal L1*t* is critical. In accordance with the present invention, setup time during normal system operation is improved by bypassing L1 latch 302, avoiding the concomitant delay. In addition, TCG 306 employs circuit design elements, described further below with respect to FIGS. 4A-4B, to relax the setup time of data signal L1*t* with respect to the clock signal clkL.

Figure 4A:
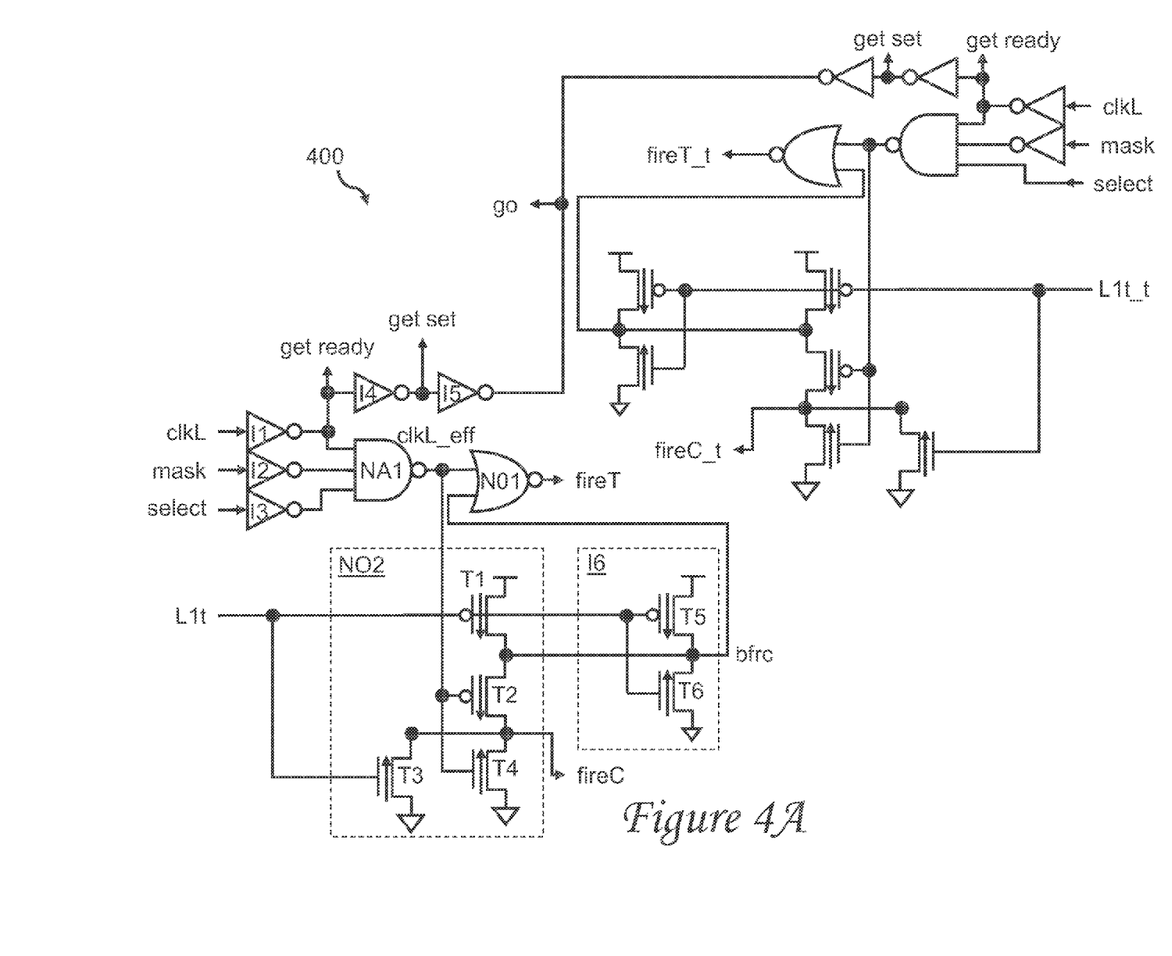
FIGS. 4A-4B together form a more detailed view of the True/Complement Generator (TCG) circuit of FIG. 3.
Figure 4B:
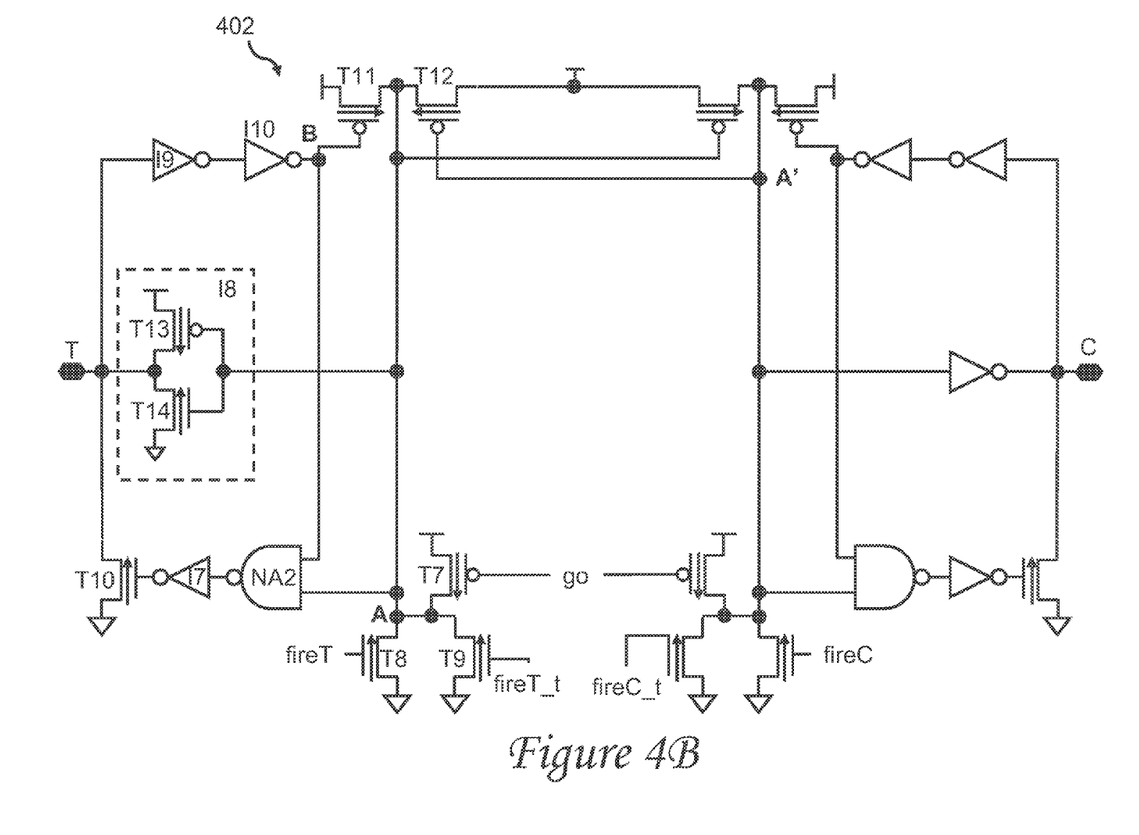

Referring now to FIGS. 4A-4B, there is depicted a more detailed view of the True/Complement Generator (TCG) 306 of FIG. 3. In the depicted embodiment, TCG 306 can be analyzed as comprising the input stage 400 depicted in FIG. 4A and the output stage 402 illustrated in FIG. 4B. Input stage 400 buffers the L1*t* (or L1*t*_t) and clkL signals so that the clock and data signals are not input directly into the highly noise-sensitive dynamic output stage 402. In accordance with one aspect of the present invention, the setup time requirement (also referred to as "strobe margin") of TCG 306 is relaxed by interconnecting the circuit elements of input stage 400 so that the clock signal utilized to time circuit operation both gates and is gated by the data signal (i.e., the effective address bit) to establish reciprocal clock and data gating.

Referring first to FIG. 4A, input stage 400 receives as inputs the clock signal clkL, the mask and select signals, and the data signals L1*t* and L1*t*_t described above with reference to FIG. 3B. In response to these inputs, input stage 400 presents to output stage 402 five signals: a go signal, fireT and fireC signals asserted during normal system operation, and fireT_t and fireC_t signals asserted during test mode operation. Because both pairs of "fire" signal are generated utilizing identical circuitry, only one "fire" signal pair (e.g., fireT and fireC) need be considered to understand the operation of input stage 400.

Referring now specifically to the portion of input stage 400 that generates the fireT and fireC signal pair, the clkL, mask and select signals are received at inverters I1, I2 and I3, respectively. The output node of inverter I1, labeled "get ready", is dotted to the corresponding nodes of the TCG 306 of adjacent bits. Node "get ready" is also connected to the input of inverter I4, which has an output a node "get set" that is again dotted with the corresponding nodes of the TCG 306 of adjacent bits. Node "get set" is further connected to the input of inverter I5, which has an output a "go" node, which is also dotted to the corresponding nodes of the TCG 306 of adjacent bits. The three stage clock buffering provided by inverters I1, I2 and I3 and the dotted interconnects there between thus synchronize the progress of clock signal clkL across the TCGs 306 of all T/C circuits 212.

As further illustrated in FIG. 4A, the outputs of inverters I1, I2 and I3 are further coupled to the inputs of a three input NAND gate NA1. The output of NAND gate NA1 is coupled to one input node (clkL_eff) of a two input NOR gate NO1, which has the signal fireT as its output.

The portion of input stage 400 that generates the fireT and fireC signal pair finally includes a NOR gate NO2 comprising transistors T1-T4 and an inverter I6 comprising transistors T5-T6. The data signal L1*t* is coupled to the gates of transistors T1 and T3 of NOR gate NO2, and the output of NAND gate NA1 is coupled to the gates of transistors T2 and T4 of NOR gate NO2. The output of NOR gate NO2 provides the signal fire C to output stage 402.

Data signal L1*t* is also connected to the gates of transistors T5 and T6 of inverter I6. The common node between transistors T1 and T2 of NOR gate NO2 is further connected to both the output node of inverter I6 and the second input node of NOR gate NO1 (bfrc). It should be noted that the illustrated interconnections between NAND gate NA1, NOR gates NO1 and NO2, and inverter I6 provide reciprocal gating between clock signal clkL and data signal L1*t* in the development of signal pair fireT and fireC.

With reference now to FIG. 4B, output stage 402 includes a pair of identical self-resetting signal amplifiers that, in response to assertion of one of the signals in the fireT, fireC and fireT_t, fireC_t signal pairs, generates a relatively constant pulse width T (True) or C (Complement) signal at the associated one of the T and C output nodes and then resets the T and C output nodes. Because the signal amplifiers for the True and Complement sides of output stage 402 are identical in structure and operation, only the True side will be described in detail herein.

As depicted, the True side of output stage 402 includes a large PFET pull-up transistor T7 connected in series to parallel NFET transistors T8 and T9 at node A. The gate of transistor T7 is connected to the "go" node, and the gates of transistors T8 and T9 are connected to receive the fireT and fireT_t signals, respectively. The go signal is received by transistor T7 in advance of receipt the fireT or fireT_t signal by one of transistors T8, T9 in order to turn off transistor T7 during firing of TCG 306. Turning off transistor T7 in advance of the firing of TCG 306 accelerates pull-down and avoids pull-up/pull-down collisions.

Node A is further coupled via inverter I8 (comprising transistors T13 and T14) to output node T and to one input of NAND gate NA2. The output of NAND gate NA2 is coupled via an inverter I7 to the gate of NFET pull-down transistor T10, which is connected between output node T and ground. Output node T is also coupled via a delay feedback path including inverters I9 and I10 to a node B that forms the second input of NAND gate NA2. Node B is further connected to the gate of a PFET transistor T11, which is connected in parallel with PFET transistor T12 between Vdd and node A. The gate of transistor T12 is connected to node A', the node on the Complement side of output stage 402 corresponding to node A. As a result of the delay feedback path comprising inverters I9 and I10 and the interconnection of transistors T11 and T12, node A is reset through the operation of transistor T11 following the output of a pulse at node T or by the operation of transistor T12 following the output of a pulse at node C. The reset operation itself is initiated by the go signal transitioning back to a low state. After the go signal goes low, nodes A and B will be both high simultaneously for a finite duration during which T10 resets output node T back to ground. The small pull-down transistor of I8 (i.e., T14) keeps output node T down after node B has gone back down and shut off T10. Thus, the circuit guarantees a minimum pulse width that is dependent on the delay of the clock signal clkL to the go signal and the delay from the go signal to output node T falling even if the fireT signal falls before the go signal falls.

Figure 5:
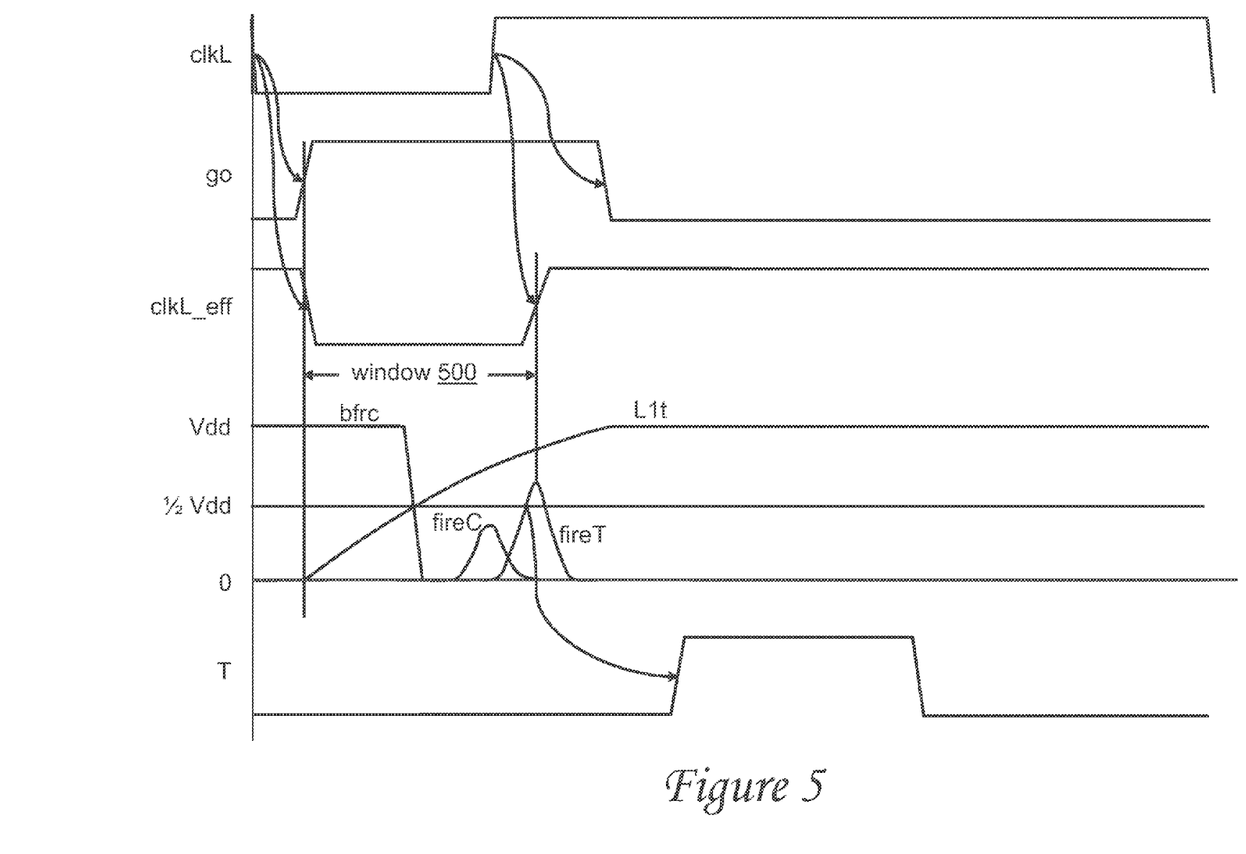
FIG. 5 is a timing diagram illustrating the operation of the TCG circuit of FIGS. 4A-4B.

Still referring to FIGS. 4A-4B and additionally to the timing diagram provided in FIG. 5, in normal system operation a TCG 306 receives the clock signal clkL and the data signal L1*t* derived from a bit of effective address 214. In an exemplary embodiment, clock signal clkL has a period of approximately 200 picoseconds (ps) and has a duty cycle of about 25%. In response to logic low assertion of clock signal clkL, inverters I1, I4 and I5 assert the go signal to a logic high state, and NAND gate NA1 asserts the input node of NOR gate NO2 labeled clkL_eff to a logic low state. The interval during which the go signal is asserted to a logic high state and clkL_eff is asserted to a logic low state defines a window 500 during which one and only one of "fire" signals fireC and fireT must be asserted to greater than a threshold voltage (e.g., ½ Vdd) for longer than a threshold duration (e.g., approximately 5 ps) in order to obtain logically correct T and C signals from output stage 402.

In the exemplary operating scenario, the data signal L1t, which has a long transition time due to long signal lines, is asserted to a logic high state. In response, inverter I6 asserts its output node brfc to a logic low state, and transistor T3 suppresses a glitch, if any, on fireC to retain it in a logic low state. Logic low states at both bfrc and clkL_eff nodes cause NOR gate NO1 to assert fireT to a logic high state after minimal delay even if the clock signal clkL has gone active well before. The "fire" signals (i.e., fireT and fireC) act as "hair trigger" signals and consist of pulses, or in a fully stressed setup condition, "glitches". The suppression of glitches on the non-asserted one of fireT and fireC is transition time sensitive; however, this sensitivity is favorable since longer input transitions on L1t lead to better glitch suppression.

If fireT achieves greater than the threshold voltage for longer than a threshold duration as shown, output stage 402 (and specifically, the combination of input transistor T8 and pull-up transistor T13 of inverter I8) responds by asserting output node T to a full rail logic high state for a relatively input-independent pulsewidth (e.g., approximately 50 ps). Thus, both the signal amplitude and duration are amplified by output stage 402. It should be noted that pull-up transistor T13 of inverter I8 provides the complete up-drive for output node T.

Output stage 402 resets following a state change at output node T as follows. Node B is in a logic high state, and node A is in a logic low state. The go signal first goes low to initiate the reset operation. Node A goes high shortly thereafter in response to operation of pull-up (reset) transistor T7. A logic high state at both of nodes A and B forces the output of NAND gate NA2 low and the output of I7 high, turning on pull-down transistor T10. As T10 causes output node T to fall, the feedback logic comprising inverters I9 and I10 will subsequently cause node B to fall. When node B falls, the outputs of NAND gate NA2 and inverter I7 revert back to their previous states, and pull-down transistor T10 turns off, ending the primary reset operation. The small pull-down transistor T14 of inverter I8 thereafter biases output node T to a logic low state, serving as a keeper once the self-limiting duration of the main reset operation has timed out.

While the invention has been particularly shown as described with reference to a preferred embodiment, it will be understood by those skilled in the art that various changes in form and detail may be made therein without departing from the spirit and scope of the invention.

What is claimed is:

1. A True/Complement circuit, comprising:
   a True/Complement generator that outputs True and Complement signals;
   a pulse generator that provides a clock signal to the True/Complement generator;
   a latch coupled to receive a data input signal and output a latched data signal to said True/Complement generator;
   a bypass data path that provides a bypass data signal to said True/Complement generator; and
   a select input coupled to the True/Complement generator that provides a select signal to said True/Complement generator to cause the True/Complement generator to select among the bypass data signal and latched data signal as a data input signal for which the True/Complement generator generates the True and Complement signals;
   wherein the True/Complement generator includes:
      a self-resetting dynamic output stage that generates the True and Complement signals in response to receipt of a fire signal; and
      an input stage that generates the fire signal, wherein the input stage generates the fire signal utilizing a plurality of logic gates that provide reciprocal gating between the data input signal and a derivative clock signal derived from the clock signal.

2. The True/Complement circuit of claim 1, wherein the output stage comprises a True portion that generates the True signal and a corresponding Complement portion that generates the Complement signal, wherein the True portion includes:
   a data node and an output node;
   set logic coupling to the data node to the output node, wherein the set logic changes a state of the output node in response to a change in state of the data node;
   a reset transistor, coupled to the data node, that resets the data node to a first state in response to a transition in a timing signal;
   an input transistor, coupled to the data node, that asserts the data node to a second state in response to receipt of a data signal;
   reset logic coupled between the output node and the data node, wherein the reset logic resets the output node to an original state in response to resetting of the data node if the output node achieves a set state, wherein the reset logic includes an reset input node; and
   feedback logic coupled between the output node and the reset input node, wherein the feedback logic limits a duration of operation of the reset logic.

3. The True/Complement circuit of claim 1, wherein the input stage includes:
   a data input that receives the data input signal;
   a clock input that receives the clock signal;
   a first logic gate having a first input coupled to the clock input, a second input coupled to the data input, a first data output and an intermediate output; and
   at least a second logic gate having a first input coupled to the clock input, a second input coupled to the intermediate output of the first logic gate, and a second data output, wherein the input state concurrently asserts a fire signal at no more than one of the first and second data outputs, wherein the interconnection of the first and second logic gates causes the clock signal to both gate and be gated by the data signal to establish reciprocal clock and data gating.

4. The True/Complement circuit of claim 1, wherein the output stage comprises a pulse width amplifier providing greater pulse width amplifications for smaller pulse widths of the fire signal than for larger pulse widths of the fire signal.

5. The True/Complement circuit of claim 1, and further comprising a mask input, coupled to the True/Complement generator, that when asserted disables generation of the True and Complement signals by the True/Complement generator.

6. A memory circuit, comprising:
   a plurality of True/Complement circuits, each including:
      a True/Complement generator that outputs True and Complement signals;

a pulse generator that provides a clock signal to the True/Complement generator;
a latch coupled to receive a data input signal and output a latched data signal to said True/Complement generator;
a bypass data path that provides a bypass data signal to said True/Complement generator; and
a select input coupled to the True/Complement generator that provides a select signal to said True/Complement generator to cause the True/Complement generator to select among the bypass data signal and latched data signal as a data input signal for which the True/Complement generator generates the True and Complement signals;
wherein the True/Complement generator includes:
a self-resetting dynamic output stage that generates the True and Complement signals in response to receipt of a fire signal; and
an input stage that generates the fire signal, wherein the input stage generates the fire signal utilizing a plurality of logic gates that provide reciprocal gating between the data input signal and a derivative clock signal derived from the clock signal;
a plurality of memory cells that receive the True and Complement signals and generate a plurality of matchline signals; and
a plurality of wordline driver circuits each coupled to receive a respective one of the matchline signals and to generate a wordline signal.

7. The memory circuit of claim 6, wherein the output stage comprises a True portion that generates the True signal and a corresponding Complement portion that generates the Complement signal, wherein the True portion includes:
a data node and an output node;
set logic coupling to the data node to the output node, wherein the set logic changes a state of the output node in response to a change in state of the data node;
a reset transistor, coupled to the data node, that resets the data node to a first state in response to a transition in a timing signal;
an input transistor, coupled to the data node, that asserts the data node to a second state in response to receipt of a data signal;
reset logic coupled between the output node and the data node, wherein the reset logic resets the output node to an original state in response to resetting of the data node if the output node achieves a set state, wherein the reset logic includes an reset input node; and
feedback logic coupled between the output node and the reset input node, wherein the feedback logic limits a duration of operation of the reset logic.

8. The memory circuit of claim 6, wherein the input stage includes:
a data input that receives the data input signal;
a clock input that receives the clock signal;
a first logic gate having a first input coupled to the clock input, a second input coupled to the data input, a first data output and an intermediate output; and
at least a second logic gate having a first input coupled to the clock input, a second input coupled to the intermediate output of the first logic gate, and a second data output, wherein the input state concurrently asserts a fire signal at no more than one of the first and second data outputs, and wherein the interconnection of the first and second logic gates causes the clock signal to both gate and be gated by the data signal to establish reciprocal clock and data gating.

9. The memory circuit of claim 6, wherein the output stage comprises a pulse width amplifier providing greater pulse width amplifications for smaller pulse widths of the fire signal than for larger pulse widths of the fire signal.

10. The memory circuit of claim 6, wherein the True/Complement generator includes a mask input that when asserted disables generation of the True and Complement signals by the True/Complement generator.

11. The memory circuit of claim 6, wherein said plurality of memory cells comprises a plurality of content addressable memory cells.

12. The memory circuit of claim 11, and further comprising:
a random access memory having a plurality of entries corresponding in number to said plurality of content addressable memory cells, wherein each entry of said plurality of entries receives one of the wordline signals generated by the plurality of wordline driver circuits.

13. The memory circuit of claim 6, wherein said memory circuit comprises an effective-to-real address translation table.

14. A processor comprising:
a cache memory that employs real addresses;
a plurality of execution units for executing instructions;
an instruction sequencing unit that fetches instructions from the cache memory for execution by the execution units; and
an effective-to-real address translation table that translates effective addresses to real addresses to permit access to the cache memory, the effective-to-real address translation table including:
a plurality of True/Complement circuits, each including:
a True/Complement generator that outputs True and Complement signals;
a pulse generator that provides a clock signal to the True/Complement generator;
a latch coupled to receive a data input signal and output a latched data signal to said True/Complement generator;
a bypass data path that provides a bypass data signal to said True/Complement generator; and
a select input coupled to the True/Complement generator that provides a select signal to said True/Complement generator to cause the True/Complement generator to select among the bypass data signal and latched data signal as a data input signal for which the True/Complement generator generates the True and Complement signals;
wherein the True/Complement generator includes:
a self-resetting dynamic output stage that generates the True and Complement signals in response to receipt of a fire signal; and
an input stage that generates the fire signal, wherein the input stage generates the fire signal utilizing a plurality of logic gates that provide reciprocal gating between the data input signal and a derivative clock signal derived from the clock signal;
a plurality of content addressable memory cells for storing effective addresses, wherein said plurality of content addressable memory cells receives the True and Complement signals and generates a plurality of matchline signals in response to an input effective address;
a plurality of wordline driver circuits each coupled to receive a respective one of the matchline signals and to generate a wordline signal;

a random access memory having a plurality of entries corresponding in number to said plurality of content addressable memory cells, wherein each entry of said plurality of receives a respective wordline signal generated by one of the plurality of wordline driver circuits.

15. The processor of claim 14, wherein the output stage comprises a True portion that generates the True signal and a corresponding Complement portion that generates the Complement signal, wherein the True portion includes:
- a data node and an output node;
- set logic coupling to the data node to the output node, wherein the set logic changes a state of the output node in response to a change in state of the data node;
- a reset transistor, coupled to the data node, that resets the data node to a first state in response to a transition in a timing signal;
- an input transistor, coupled to the data node, that asserts the data node to a second state in response to receipt of a data signal;
- reset logic coupled between the output node and the data node, wherein the reset logic resets the output node to an original state in response to resetting of the data node if the output node achieves a set state, wherein the reset logic includes an reset input node; and
- feedback logic coupled between the output node and the reset input node, wherein the feedback logic limits a duration of operation of the reset logic.

16. The processor of claim 14, wherein the input stage includes:
- a data input that receives the data input signal;
- a clock input that receives the clock signal;
- a first logic gate having a first input coupled to the clock input, a second input coupled to the data input, a first data output and an intermediate output; and
- at least a second logic gate having a first input coupled to the clock input, a second input coupled to the intermediate output of the first logic gate, and a second data output, wherein the input state concurrently asserts a fire signal at no more than one of the first and second data outputs, and wherein the interconnection of the first and second logic gates causes the clock signal to both gate and be gated by the data signal to establish reciprocal clock and data gating.

17. The processor of claim 14, wherein the output stage comprises a pulse width amplifier providing greater pulse width amplifications for smaller pulse widths of the fire signal than for larger pulse widths of the fire signal.

* * * * *